United States Patent [19]
Ohseto et al.

[11] Patent Number: 4,720,436
[45] Date of Patent: Jan. 19, 1988

[54] ELECTROLUMINESCENCE DEVICES AND METHOD OF FABRICATING THE SAME

[75] Inventors: Seiichi Ohseto; Yoshiyuki Kageyama, both of Numazu; Kenji Kameyama, Yokohama, all of Japan

[73] Assignee: Ricoh Company, Ltd., Tokyo, Japan

[21] Appl. No.: 903,765

[22] Filed: Sep. 5, 1986

[30] Foreign Application Priority Data

Sep. 11, 1985 [JP] Japan ................................ 60-199533
Sep. 26, 1985 [JP] Japan ................................ 60-210930
Mar. 27, 1986 [JP] Japan ................................ 61-067156

[51] Int. Cl.⁴ .................... H05B 33/00; H05B 33/10; H05B 33/14
[52] U.S. Cl. .................................. 428/690; 428/917; 313/503
[58] Field of Search .................... 428/690, 691, 917; 313/503

[56] References Cited

U.S. PATENT DOCUMENTS

| 2,675,331 | 4/1954 | Cusano et al. | 428/690 X |
| 3,728,594 | 4/1973 | Yim et al. | 313/503 X |
| 4,442,377 | 4/1984 | Higton et al. | 313/503 |

FOREIGN PATENT DOCUMENTS 2133927 8/1984 United Kingdom ................ 313/503

Primary Examiner—Nancy Swisher
Attorney, Agent, or Firm—Oblon, Fisher, Spivak, McClelland & Maier

[57] ABSTRACT

A thin film electroluminescent device is disclosed which includes an electroluminescent emitting layer comprising an alkaline-earth selenide, such as SrSe (strontium selenide) and calcium selenide (CaSe), or an alkaline-earth sulfide, such as CaS (calcium sulfide) and strontium sulfide (SrS), as the luminescent host material, and a lanthanoid rare-earth element as an activator, and a method of fabricating the same is also disclosed.

4 Claims, 10 Drawing Figures

ELECTROLUMINESCENCE DEVICES AND METHOD OF FABRICATING THE SAME

BACKGROUND OF THE INVENTION

The present invention relates to a thin film electroluminescence device including a luminescence emitting layer comprising an alkaline-earth selenide, such as SrSe (strontium selenide) and calcium selenide (CaSe), or an alkaline-earth sulfide, such as CaS (calcium sulfide) and strontium sulfide (SrS), as the luminescent host material, and a lanthanoid rare-earth element as an activator, and a method of fabricating the thin film electroluminescence device.

Zinc sulfide (ZnS) which is well known as a host material for an electroluminescence device can attain orange electroluminescent (hereinafter referred to as EL) emission with addition thereto of manganese as an activator, and green EL emission with addition thereto of terubium as an activator. However, blue EL emission cannot be attained by use of zinc sulfide. Therefore, it cannot be used as a host material for a multi-color EL device.

In contrast to this, it is conventionally known that calcium sulfide (CaS) and strontium sulfide (SrS) can be used as a host material for a multi-color EL device when a lanthanoid rare-earth element is used as an activator for them, as reported, for example, in W. Lehmann, J. Lumin. 5, 87(1972), and A. Vecht and J. Mayo, SID (Society for Information Displays) International Symposium Digest of Technical Papers, p. 88 to 89 (1977).

Alkaline-earth selenides, such as SrSe and CaSe, however, have not been studied as a host material for EL devices. This is considered to be not because such selenides have some intrinsic defects in the crystalline structure, but because it has been extremely difficult to prepare those selenides with high purity in a flawless manner.

Alkaline-earth sulfides, such as CaS (calcium sulfide) and strontium sulfide (SrS), belong to the group of IIa–VIb compounds and have melting points as high as about 2000° C. Further, the alkaline-earth metals themselves are so easily oxidized that when producing a thin film of such alkaline-earth sulfides, the electron beam (EB) evaporation method and the sputtering method have to be employed. The thin films of the alkaline-earth sulfides prepared by the above methods, however, have the following shortcomings:

(1) It is extremely difficult to purify SrS and CaS to the extent that the purified compounds satisfy their respective stoichiometric compositions.

(2) Extremely difficult treating processes are required for the formation of a thin film of such alkaline-earth sulfides as described in a report by V. Shanker et al., at page 509 of the 31 Applied Physics Session Hand-out (1984. 3). Specifically, coevaporation of CaS and S, CaS by the EB evaporation and S by the resistance heating evaporation, must be performed to deposit a film on a substrate, and after the formation of a thin film, the film must be thermally treated in vacuum or in an atmosphere of hydrogen sulfide ($H_2S$) at a temperature which is much higher than the temperature of the substrate at the film deposition. If such after-treatment is not performed, EL characteristics necessary for practical use cannot be obtained.

This is considered to be because sulfur has an extremely higher vapor pressure and is much more easily sublimed as compared with calcium (Ca), strontium (Sr), and numerous S-vacant points are formed in the film, so that the composition of the film becomes non-uniform in the direction of the thickness of the film. These problems stem from the properties of the materials themselves and cannot be solved by the EB evaporation method. (3) The EB evaporation method is not suitable for the fabrication of EL devices, because it cannot always yield a film having a uniform thickness. In other words, the films prepared by the EB evaporation method have a relatively large distribution in terms of the thickness thereof. Furthermore, a large film having a uniform thickness is necessary for EL devices and the performance of EL devices largely depend upon the uniformity of the thickness of the film.

SUMMARY OF THE INVENTION

It is therefore a first object of the present invention to provide a thin film EL device from which the problems of the conventional EL devices have been eliminated, capable of attaining highly bright EL emission, in which a thin film of an alkaline-earth selenide, such as SrSe (strontium selenide) and calcium selenide (CaSe), is employed as the host material, with addition thereto of a lanthanoid rare-earth element as an activator.

A second object of the present invention is to provide a method of providing a thin film of an alkaline-earth sulfide, such as CaS (calcium sulfide) and strontium sulfide (SrS), by which a large thin film of the alkaline-earth sulfide can be obtained at a low film formation temperature, which film is capable of attaining EL emission with high brightness when used in an EL device.

The thin film EL device in the first object of the present invention comprises an EL emitting layer comprising SrSe or CaSe as a host material and a lanthanoid rare-earth element as an activator.

This thin film EL device is fabricated by reactive vacuum coevaporation of Se, an alkaline rare-earth iodide or chloride, and a lanthanoid rare-earth element, onto a heated substrate, in a vacuum chamber. More specifically, selenium is evaporated from a material consisting essentially of selenium placed in an evaporation cell, and an alkaline rare-earth iodide or chloride is also evaporated from a material consisting essentially of the alkaline rare-earth iodied or chloride placed in another evaporation cell, and an activator is evaporated from the evaporation cell of Se, or from the evaporation cell of the alkaline rare-earth iodide or chloride, or from a different evaporation cell.

In the above method, a hot-cathode which emits thermions and an anode can be additionally disposed near the outlet of at least one of the evaporation cells, so that the vapor coming from the evaporation cell is ionized or converted to a plasma.

The second object of the present invention is attained as follows: Sulfur is evaporated from a material consisting essentially of sulfur placed in an evaporation cell, and an alkaline rare-earth iodide or chloride is also evaporated from a material consisting essentially of the alkaline rare-earth iodied or chloride placed in another evaporation cell, so that reactive vacuum deposition of these vapors onto a heated substrate is performed in a vacuum chamber, thereby forming a thin film of an alkaline rare-earth sulfide on the heated substrate. In this method, the above-mentioned ionization or conversion into a plasma of the vapors from the respective evaporation cells can also be employed.

Alkaline rare-earth metals are so easily oxidized that if alkaline rare-earth metals themselves are used as the materials to be evaporated, the moment they are placed in an evaporation cell, they are oxidized. The result is that the deposited film contains a large amount of oxygen, and the desired EL characteristics cannot be obtained.

In order to avoid the above problems, alkaline rare-earth iodides or chlorides are employed as the coevaporation materials in the present invention. These compounds are useful for the following reasons:

(1) The bonding energy of iodine with the alkaline rare-earth metals is the smallest of halogen atoms and the melting point of iodine is low. Therefore, iodine rarely gets mixed in the deposited film.

(2) Even if such halogen element gets mixed in the deposited film, it does not have any adverse effects on the EL characteristics of the deposited film since the halogen works as coactivator in the case of an EL device using a II-VI group compound as the host material.

DETAILED DESCRIPTION OF THE PREFERRED EMBODIMENTS

Figure 1:
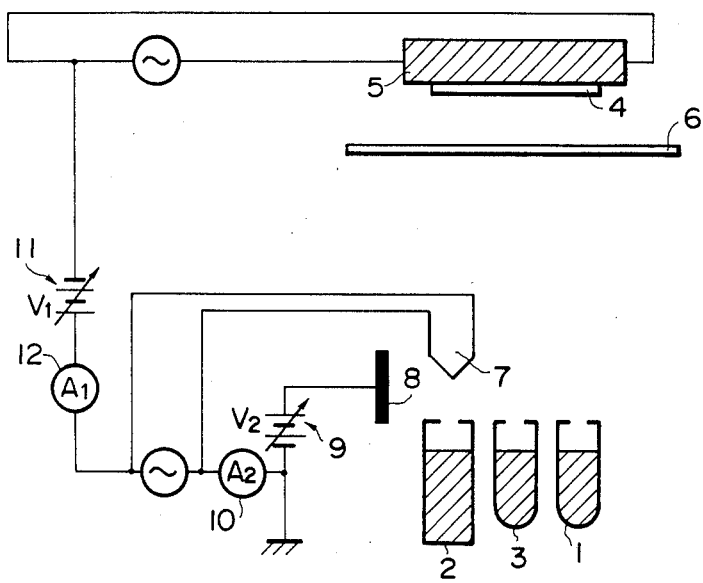
FIG. 1 is a schematic illustration of a reactive coevaporation apparatus for fabricating an EL thin film layer for use in the present invention.

A method of fabricating an EL emitting layer in which an alkaline rare-earth selenide is employed as the host material will now be explained.

In this method, a thin film of an alkaline rare-earth selenide (MSe) is formed on a heated substrate by the reactive coevaporation of an alkaline rare-earth halogenide ($MX_2$) and Se in accordance with one or both of the following reaction procedures (A) and (B):

$$2MX_2(S) \longrightarrow 2M(G) + 2X_2(G) \quad (A)$$

-continued
$$2M(G) + Se_2 \longrightarrow 2MSe(S)$$

$$2MX_2(G) + Se_2(G) \longrightarrow 2MSe(S) + 2X_2(G) \quad (B)$$

where G represents a gaseous state, and S represents a solid state.

More specifically, Se is evaporated in vacuum from an evaporation cell containing a material consisting essentially of Se, and an alkaline rare-earth iodide or chloride is also evaporated in vacuum from an evaporation cell containing a material consisting essentially of an alkaline rare-earth iodide or chloride, and the evaporated Se and alkaline rare-earth iodide or chloride react at the surface of a heated substrate, so that a thin film of MSe is caused to grow on the substrate with elimination of $I_2$ or $Cl_2$ from the reaction system. Therefore, this is a kind of coevaporation method.

In the present invention, it has been discovered that by addition of an ionization process to the above coevaporation method, the quality of the EL emitting layer can be significantly improved. Specifically, by the addition of the ionization process, the vapor of selenium which has a relatively high vapor pressure is ionized, so that a MSe film having excellent crystallinity can be obtained without changing the temperature of the substrate. The result is that the performance of the EL device is improved.

In this method, when a heating resistor is employed for heating all the evaporation cells, the evaporation area can be changed as desired, so that a large size EL emitting layer can be prepared.

An activator can be contained in any of the evaporation sources of $MX_2$ and Se, or in a different evaporation source.

As the activator, lanthanoid rare-earth elements, such as Ce (cerium), Eu (europium) and Tb (terbium), can be employed.

When cerium is employed as the activator, the EL device emits highly bright luminescent light, and a peculiar phenomenon is observed that the spectrum of the light changes when the amount of the cerium and other fabricating conditions are changed. In this sense, cerium is one of the most useful activators. For instance, in the case of a SrSe:Ce emitting layer, the emitting light can be changed in color continuously from blue to green. Therefore, EL devices can be fabricated so as to emit the light with a desired different color by use of a host material of the same type and cerium.

A thin film electroluminescence (TFEL) device including the above emitting layer according to the present invention will now be explained with reference to FIG. 2.

As shown in the figure, a transparent electrode layer 13 is formed on a substrate 4. An EL emitting layer 14, an insulating layer 15 and an electrode 16 are successively overlaid on the transparent electrode layer 13. A second insulating layer can be interposed between the transparent electrode 13 and the EL emitting layer 14, which second insulating layer can be made of the same material as that of the first mentioned insulating layer 15 or a different material. Alternatively an insulating layer is formed on one side or both sides of the EL emitting layer 14. A transparent electrode is further disposed on both sides of the EL emitting layer to form an EL emitting layer unit. In the same manner, another emitting layer unit of the abovementioned type is fabricated and is placed on the first mentioned emitting layer unit. Any number of these emitting layer units can be overlaid to obtain multi-color electroluminescence. As a matter of course, the activators contained in the EL emitting layers of these units should be different from each other.

The transparent electrode layer 13 is made of ZnO-:Al. It can also be made of the conventionally employed ITO. ZnO:Al is more heat-resistant than ITO.

The above insulating layers are made of $Y_2O_3$. They can also be made of other dielectric materials or ferroelectrics.

The present invention will now be explained in detail with reference to the following examples. The present invention is not limited to these examples.

EXAMPLE 1

Figure 2:
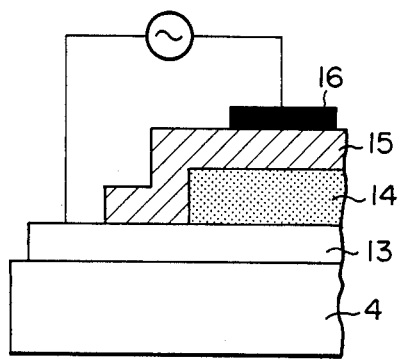
FIG. 2 is a schematic illustration of an EL device according to the present invention.

A thin film electroluminescence (TFEL) device as illustrated in FIG. 2 was fabricated by successively overlaying on a glass substrate 4 a ZnO:Al transparent electrode layer 13, a SrSe:Ce EL emitting layer 14, an $Y_2O_3$ insulating layer 15, and an Al electrode layer 16.

The ZnO:Al transparent electrode layer 13 was formed with a thickness of 2000 Å by the DC magnetron sputtering method at a substrate temperature of 300° C.

The $Y_2O_3$ insulating layer 13 was formed with a thickness of 2000 Å by the electron beam evaporation method and the Al electrode layer was formed by the resistance-heating evaporation.

The SrSe:Ce EL emitting layer 14 was formed by the coevaporation method by use of the apparatus as illustrated in FIG. 1.

In the figure, resistance-heating type evaporation cells 1, 2 and 3 for coevaporation which respectively contains anhydrous $SrI_2$, Se, and $CeCl_3$ which were dehydrated by heating in vacuum.

On the glass substrate 4, the ZnO:Al transparent electrode 13 (not shown in FIG. 1) is formed. The glass substrate 4 is supported by an electroconductive heating holder 5. A hot-cathode filament 7, made of a material consisting essentially of tungsten with addition thereto of cerium oxide so as to facilitate the emission of thermions, is disposed near the evaporation cell 2 for Se in such a position as to face an anode (ionization electrode) 8.

A DC volt $V_2$ is applied across the hot-cathode filament 7 and the anode 8 by a two-electrode power source 9 and the electric current thereof is measured by a two-electrode ammeter 10.

The electroconductive heating holder 5 is grounded through a bias power source 11 and an ammeter 12 for the measurement of the ionization toward the glass substrate 4. A shutter 6 is disposed between each evaporation cell and the glass substrate 4.

By use of the above apparatus, the temperature of each evaporation cell was appropriately controlled in accordance with the previously mentioned reaction procedures, so that a SrSe:Ce thin film was formed on the heated glass substrate.

Suppose that the respective saturated vapor pressures of Se, Sr and SrSe are $P_{Se}$, $P_{Sr}$, and $P_{SrSe}$. The following relationship exits between them: $P_{Se} > P_{Sr} > P_{SrSe}$. Therefore, the temperatures of the evaporation cells were controlled in such a manner that at least the evaporation amount of Se was more than that of Sr, whereby the problem that unreacted Sr may remain in the SrSe was avoided and a thin film of uncontaminated polycrystalline SrSe was selectively caused to grow on the appropriately heated substrate.

The amount of Ce can be determined in an appropriate range in accordance with the desired emission ratio. This can be determined by adjusting the temperature of the evaporation cell for $CeCl_3$ or the electric current applied for heating the cell. The necessary relative conditions for adjusting the amount of Ce are also determined by other external conditions, such as the shape and configuration of each cell, and the growing rate of the SrSe layer. Therefore, specific numerical values for such conditions are not given here. The heating conditions and the added amount of Ce are determined in view of the emission efficiency. The same thing applies to the other examples which will be explained later.

Figure 3:
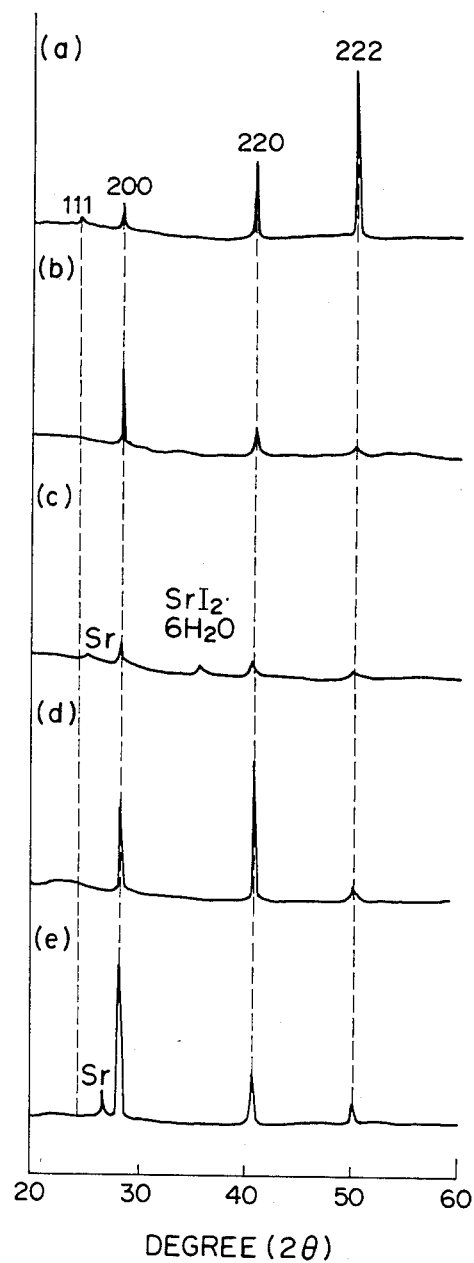
FIG. 3 is an X-ray diffraction pattern diagram of a SrSe:Ce thin film prepared in Example 1.

FIG. 3 show the X-ray diffraction patterns of SrSe:Ce emitting layers which were prepared by changing the substrate temperature and inonization conditions. In the figure, diffraction lines (111), (200), (220) and (222) belong to the SrSe crystal in a NaCl structure.

(a), (b) and (c) indicate SrSe layer samples which were prepared by changing the substrate temperature, but without adopting the inonization process. The SrSe layer sample (a) was prepared at a substrate temperature of 550° C., the SrSe layer sample (b) at 470° C., and the SrSe layer sample (c) at 370° C. It is indicated that the crystallinity of the SrSe layers improved as the substrate temperature was elevated. In particular, at 550° C., the orientation to the (111) plane was observed.

(d) indicates a SrSe layer sample which was prepared at a substrate temperature of 370° C. as in the case of the SrSe layer sample (c), but with addition of the ionization process to the apparatus shown in FIG. 1. In comparison with the SrSe layer sample (c), the crystallinity of the SrSe layer sample (d) conspicuously improved.

(e) indicates a SrSe layer sample which was prepared by exchanging the position of the evaporation cell 1 for $SrI_2$ with the position of the evaporation cell 2 for Se, so as to mainly ionize $SrI_2$. In comparison with the sample (c), the sample (e) exhibited more intense diffraction lines. The diffraction line caused by the Sr crystals was also observed.

Therefore, it is considered that the crystallization of SrSe was promoted in the sample (e) by the ionization of $SrI_2$, but Sr which was not involved in the reaction was also crystallized and mixed in the sample (e).

The above results indicate that in the coevaporation of Sr and Se, the crystallinity of SrSe is improved and formation of a thin film of SrSe is made possible, not by the ionization of Sr, but by the ionization of Se.

TFEL devices (c), (d) and (e), each having a structure as shown in FIG. 2, were fabricated by respectively using as the EL emitting layer a SrSe:Ce layer (c), a SrSe:Ce layer (d) and a SrSe:Ce layer (e) which were formed at a substracte temperature of 370° C. These TFEL devices were evaluated with respect to their EL brightness by applying a 5 kHz alternating pulse voltage.

The emission brightness of the sample (d) is about 10 times that of the sample (c), and the emission brightness of the sample (e) is about 20 times that of the sample (c). This indicates that the effect of the ionization on the crystallinity of the SrSe layer directly reflects the emission brightness. In other words, in comparison with the case where no ionization is performed, more brightness is obtained by incorporating the ionization process. This effect is more conspicuous when Se is ionized than when Sr is ionized.

Figure 4:
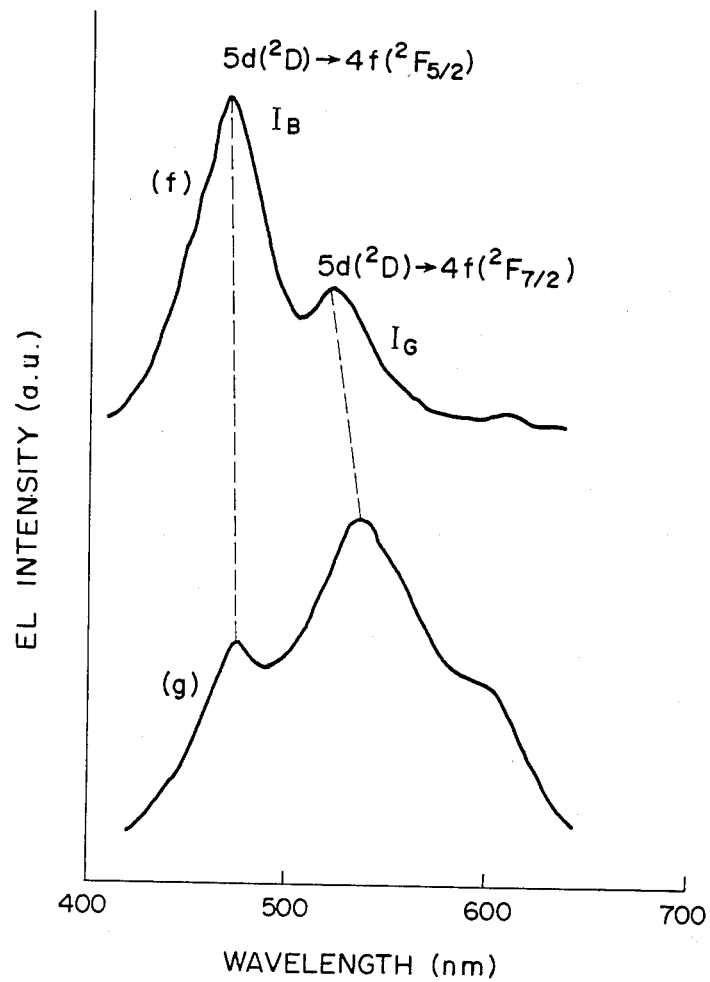
FIG. 4 is an EL spectrum of a SrSe:Ce EL device according to the present invention.

FIG. 4 shows the EL spectra of two SrSe:Ce TFEL devices (f) and (g). The SrSe:Ce TFEL device (f) was prepared by ionizing Se with an ionizing power of 130 W, at a substrate temperature of 420° C., and the SrSe:Ce TFEL device (g) was prepared by ionizing Se with an ionizing power of 40 W, at the same substrate temperature as mentioned above. The electroluminescence of each device comprises an emission band having a peak (with an intensity of $I_B$) at about 465 nm and an emission band having a peak (with an intensity of $I_G$) at about 530 nm.

The dispersion of the relative intensity of $I_B/I_G$ is determined in accordance with the fabricating conditions of the SrSe:Ce layer. Accordingly the EL emission color changes in the range of green to blue, depending upon the fabricating conditions of the SrSe:Ce layer.

Further, it has been discovered that the dispersion of the relative intensity of $I_B/I_G$ is controlled by the ionization conditions and the concentration of Ce.

Figure 5:
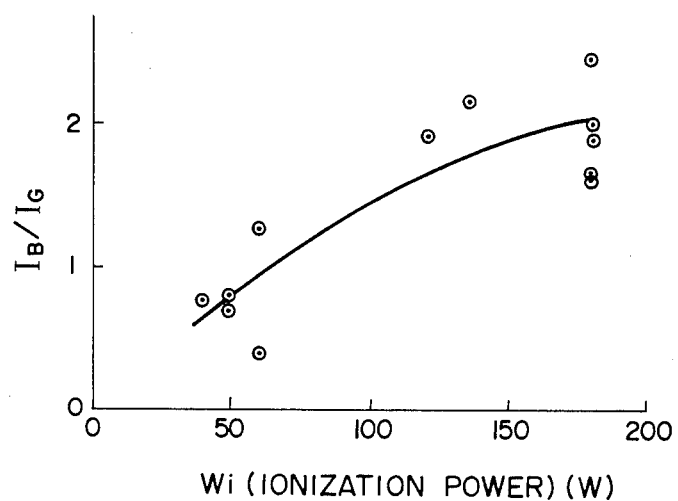
FIG. 5 is a graph showing the dependence of the color tone of the EL emission of the SrSe:Ce EL device upon the ionization conditions.

FIG. 5 is a graph showing the dependence of the relative intensity of $I_B/I_G$ upon the ionization power Wi which is defined to be a product of the two-electrode voltage $V_2$ and the two-electrode current $A_2$ as shown in Fig. 1.

Figure 6:
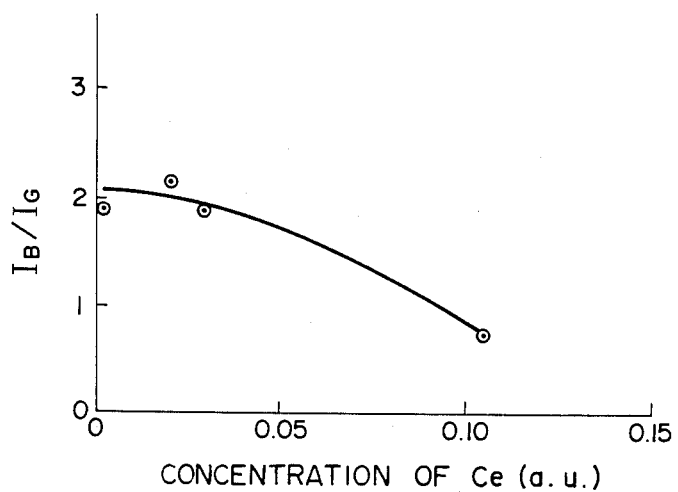
FIG. 6 is a graph showing the dependence of the EL color tone of the EL emission of the SrSe:Ce EL device upon the concentration of Ce.

FIG. 6 is a graph showing the dependence of the relative intensity of $I_B/I_G$ upon the concentration of Ce. The concentration of Ce shown in the graph is the value obtained by the SIMS analysis of the SrSe layer, which is shown by the relative intensity of Ce with respect to SrO by use of an arbitrary scale.

The results shown in the graph indicate that the greater the ionization power Wi (and the lower the concentration of Ce), the greater the relative intensity of $I_B/I_G$. Therefore, it is possible to fabricate a TFEL device which can select the desired color tone from blue to green by using the same materials if the ionization power Wi and the amount of Ce added are appropriately controlled.

The maximum brightness was about 1000 cd/m$_2$.

The effect of the bias voltage $V_1$ at the time of formation of the SrSe:Ce layer was that when $V_1$ was $-100$ V, the total improvement of the brightness was about 20% to 30%.

EXAMPLE 2

By use of the same apparatus as that employed in Example 1, a TFEL device including an EL emitting layer 14 consisting essentially of SrSe:Eu was fabricated.

Specifically, Example 1 was repeated except that EuCl$_3$ was placed in the evaporation cell 3.

To the thus obtained SrSe:Eu TFEL device, a 5 KHz alternating pulse voltage was applied as in Example 1. As a result, red EL emission, having a broad peak in the range of 600 nm to 700 nm, was obtained.

EXAMPLE 3

By use of the same apparatus as that employed in Example 1, a TFEL device including an EL emitting layer 14 consisting essentially of SrSe:Tb was fabricated.

Specifically, Example 1 was repeated except that TbCl$_3$ was placed in the evaporation cell 3.

To the thus obtained SrSe:Eu TFEL device, a 5 KHz alternating pulse voltage was applied as in Example 1. As a result, green EL emission, having a peak around 550 nm, was obtained.

EXAMPLE 4

By use of the same apparatus as that employed in Example 1, a TFEL device including an EL emitting layer 14 consisting of CaSe:Ce was fabricated.

Specifically, Example 1 was repeated except that anhydrous CaI$_2$, Se, and CeCl$_3$ were respectively placed in the evaporation cells 1, 2 and 3, and by co-evaporation of these compounds, a CaSe:Ce layer was formed on the ZnO:Al transparent electrode layer 13, whereby the above-mentioned TFEL device having the same structure as that fabricated in Example 1 was fabricated.

Suppose that the respective saturated vapor pressures of Se, Ca and CaSe are $P_{Se}$, $P_{Ca}$, and $P_{CaSe}$. As in the case of the previously discussed SrSe layer, the following relationship exits between them: $P_{Se} > P_{Ca} > P_{CaSe}$. Therefore, the temperatures of the evaporation cells were controlled in such a manner that at least the evaporation amount of Se was more than that of Ca.

It was confirmed by X-ray diffraction patterns that the CaSe layer has the same crystalline structure of the NaCl type as that of SrSe layer. Further, it was found that the relationship between the crystallinity of the CaSe layer, the substrate temperature, and the ionization conditions was similar to that in the case of the SrSe layer described in Example 1.

To the thus obtained CaSe:Ce TFEL device, a 5 KHz alternating pulse voltage was applied as in Example 1. As a result, green EL emission, having two broad peaks in the range of 500 nm to 600 nm, was obtained.

It was found that the relationship between the relative intensity ratio of the two emission bands and the fabricating conditions was similar to that in the case of the SrSe:Ce TFEL device described in Example 1. Specifically, the greater the concentration of Ce (or the lower the ionization power Wi), the relatively greater the emission by the emission band on a lower energy side. The maximum brightness was about 10000 cd/m$_2$.

EXAMPLE 5

By use of the same apparatus as that employed in Example 4, a TFEL device including an EL emitting layer 14 consisting essentially of CaSe:Eu was fabricated.

Specifically, Example 4 was repeated except that EuCl$_3$ was placed in the evaporation cell 3.

To the thus obtained CaSe:Eu TFEL device, a 5 KHz alternating pulse voltage was applied as in Example 4. As a result, red EL emission, having a broad peak in the range of 600 nm to 700 nm, was obtained.

EXAMPLE 6

By use of the same apparatus as that employed in Example 4, a TFEL device including an EL emitting layer 14 consisting essentially of CaSe:Tb was fabricated.

Specifically, Example 4 was repeated except that TbCl$_3$ was placed in the evaporation cell 3.

To the thus obtained CaSe:Tb TFEL device, a 5 KHz alternating pulse voltage was applied as in Example 4. As a result, green EL emission, having a peak around 550 nm, was obtained.

Examples 1 through 6 indicate that SrSe and CaSe are useful as the host materials of the TFEL devices in which Ce ion, Eu ion or Tb ion is employed as the activator.

Ce and Eu, in the respective stable states $Ce^{3+}$ and $Eu^{2+}$, each have the emission characteristics which are caused by the transition between the f electron orbit and the d electron orbit. Tb, in the stable state $Tb^{3+}$, has the emission characteristics caused by the transition in the f electron orbit.

These are representative lanthanoid rare-earth ions in terms of the above emission mechanism. In this sense, the utility of the above-mentioned SrSe and CaSe can be applied to all the lanthanoid rare-earth elements. Of course, the matching of individual lanthanoid rare-earth elements may be different, for instance, depending upon the ion radius ratio of Sr or Ca (the host material) to each lanthanoid rare-earth element and the ion valence thereof. However, the utility of SrSe and CaSe in combination with all the lanthanoid rare-earth elements is not negatived at all.

Further, in the above Examples, chlorine was employed as the coactivator. However, in the present invention, the coactivator is not limited to chlorine, because the activator for use in the TFEL devices according to the present invention is not an activator in a molecular state.

Further, in the above Examples, the EL effect was discovered by forming a CaSe or SrSe thin film by the coevaporation or the ionization coevaporation of $CaI_2$ or $SrI_2$ and Se. The present invention is not limited to the above thin film formation method, but any methods can be employed as long as the properties required for the EL host material or crystal can be obtained.

Further, in the above Examples, the alkaline earth iodides such as $CaI_2$ and $SrI_2$ are employed as one component for the coevaporation. Instead of such alkaline earth iodides, alkaline earth chlorides can also be employed. However, alkaline earth fluorides are not suitable since the fluorides themselves are stable and a large amount of fluorine gets mixed in the thin film, so that a resistance-heating evaporation source cannot be employed in the case of alkaline earth fluorides.

As the other component for the coevaporation, Se was used in the above Examples. Instead of Se, chalcogens such as S and Te can also be employed in the same manner as in the case of Se.

The results of Examples 1 and 4 indicate that the film formation at low temperatures can be attained by the coevaporation method in combination with ionization process.

The ionization process has the features that the evaporation gases to be ionized can be selected as desired and no inert gases are necessary. Instead of the above-mentioned ionization process, other ionization processes and a plasma-conversion process can also be employed likewise.

In the above-mentioned method, all the evaporation sources or cells can be heated by a heating resistor. Therefore, unlike the electron beam evaporation method, the evaporation area can be changed as desired and a large evaporation area can be obtained without difficulty.

EXAMPLE 7

Figure 7:
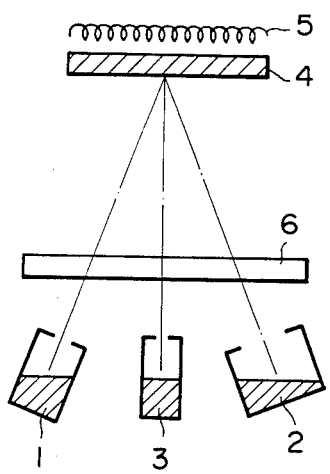
FIG. 7 is a schematic illustration of another reactive coevaporation apparatus for fabricating an EL thin film layer for use in the present invention.
Figure 8:
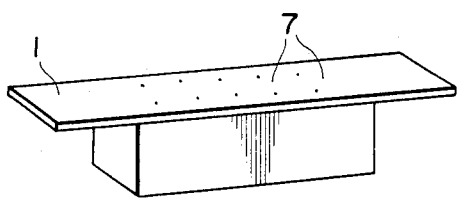
FIG. 8 is a schematic illustration of an evaporation cell in the reactive coevaporation apparatus shown in Fig. 7.

In a vacuum chamber (not shown in FIG. 7), 4N grade $SrI_2 \cdot X(H_2O)$ was placed in an evaporation cell 1 as shown in FIG. 7. Likewise, 5N grade S was placed in an evaporation cell 2 and 4N grade cerium chloride ($CeCl_3$) in an evaporation cell 3.

In each of the evaporation cells, a number of evaporation apertures 7 having an aperture size of 0.3 mm were formed, through which the vapor of the material placed in each cell reached a substrate 4 made of quarz.

Figure 9:
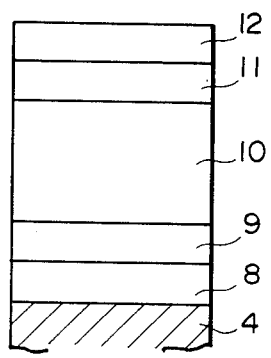
FIG. 9 is a schematic illustration of the layer structure of a thin film EL device according to the present invention.

On the substrate 4, an ITO layer 8 having a thickness of 500 Å was formed by the electron beam evaporation method, and on the ITO layer 8, an yttrium oxide ) layer 9 was formed as illustrated in FIG. 9.

The vacuum chamber was evacuated to a vacuum degree of $2 \times 10^{-6}$ Torr and the substrate 4 was heated to 400° C. by a heater 5 and the evaporation cell 1 was then heated to 200° C., so that the water of crystallization contained in $SrI_2$ was eliminated.

After this dehydration, the evaporation cell 1 was heated to 650° C., the evaporation cell 2 to 200° C., and the evaporation cell 3 to 600° C., and the shutter 6 was opened, so that the coevaporation was performed.

A host SrS crystalline layer working as an EL emitting layer 10 was formed on the yttrium oxide ($Y_2O_3$) layer 9 under one or both of the following reaction procedures:

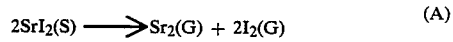
(A)

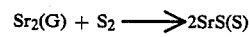

(B)

where G represents a gaseous state, and S represents a solid state.

To the SrS EL layer, an activator Ce was added from the evaporation cell 3. The evaporation was continued for 60 minutes and an almost transparent SrS:Ce,Cl thin layer having a thickness of 1.2 μm was formed.

The results of Auger electron spectroscopic analysis of the SrS:Ce,Cl thin layer indicated that the concentration ratio of Sr to S was about 1 from the investigation of the obtained SrS powder, and the concentration of Ce was about 0.1 mol %. Further, the Auger electron spectroscopic analysis indicated that iodine was not detected.

On the the SrS:Ce,Cl thin layer (the EL layer 10), an yttrium oxide ($Y_2O_3$) layer 11 was formed with a thickness of 2000 Å by the electron beam evaporation method. On the yttrium oxide layer 11, an Al electrode layer 12 was formed by the resistance heating evaporation, whereby an EL device as shown in FIG. 9 was fabricated.

To the thus fabricated SrS:Ce,Cl TFEL device, a 5 KHz alternating pulse voltage was applied between the ITO layer 8 and the Al layer 11. As a result, greenish blue EL emission, having a peak around 480 nm, was obtained.

The brightness of the EL emission was about 700 cd/m2 when the applied voltage $V_{o-p}$ was 220 V. This brightness was much greater than the brightness (ranging from 300 to 500 cd/m2) obtained by an equivalent TFEL device fabricated by the conventional electron beam evaporation or the electron beam—resistance-heating coevaporation.

EXAMPLE 8

By use of the same apparatus as that employed in Example 7, a TFEL device including an EL layer 10 consisting of CaS:Ce,Cl was fabricated.

Specifically, Example 7 was repeated except that $SrI_2 \cdot X(H_2O)$ in the evaporation cell 1 was replaced with 4N grade $CaI_2$. In other words, a host CaS crystalline layer was formed by the coevaporation of $CaI_2$ and S.

The temperature of the evaporation cell 1 for $CaI_2$ was set at 820° C. Since $CaI_2$ did not contain water of crystallization unlike $SrI_2 \cdot X(H_2O)$, the dehydration process was unnecessary.

The thus fabricated TFEL device was the same in structure as that illustrated in FIG. 9. The EL emitting layer was 1.0 μm thick.

Auger electron spectroscopic analysis of the CaS:Ce,Cl thin layer indicated that the concentration ratio of Ca to S was about 1, and the concentration of Ce was about 0.1 mol %. Further, no iodine was detected by the Auger electron spectroscopic analysis.

A 5 KHz alternating pulse voltage was applied to the thus fabricated CaS:Ce,Cl TFEL device. As a result, green EL emission, having a broad peak in the range of 500 nm to 550 nm, was obtained.

The brightness of the EL emission was about 800 $cd/m_2$ when the applied voltage $V_{o-p}$ was 220 V. This brightness was much greater than the brightness (ranging from 500 to 600 $cd/m^2$) obtained by an equivalent TFEL device fabricated by the conventional electron beam evaporation or the electron beam—resistance-heating coevaporation.

EXAMPLE 9

By use of the same apparatus as that employed in Example 7, a TFEL device including an EL layer 10 consisting of CaS:Eu,Cl was fabricated.

Specifically, Example 8 was repeated except that $EuCl_3$ was placed in the evaporation cell 3 and the temperature of the cell was set at 900° C.

The concentration of Eu was 0.1 mol % or less.

A 5 KHz alternating pulse voltage was applied to the thus fabricated CaS:Ce,Cl TFEL device. As a result, red EL emission, having a peak at 650 nm, was obtained.

The brightness of the EL emission was about 200 $cd/m_2$ when the applied voltage $V_{o-p}$ was 220 V. This brightness was much greater than the brightness (100 $cd/m^2$) obtained by an equivalent TFEL device fabricated by the conventional electron beam evaporation or the electron beam—resistance-heating coevaporation.

EXAMPLE 10

A 4-winding RF coil was disposed between the substrate 4 and the shutter 6 in the apparatus shown in FIG. 7 and was connected to a high frequency power source (not shown) through a matching box (not shown). An argon gas was introduced into the vacuum chamber through a gas inlet (not shown) with a back pressure of the vacuum chamber maintained at $10^{-6}$ Torr or less.

A SrS:Ce,Cl EL layer 10 was formed by the ion plating method under the same conditions as in Example 7 except the following conditions:

| | |
|---|---|
| Vacuum degree: | $3 \times 10^{-4}$ Torr |
| High frequency power: | 200 W |
| Acceleration voltage: | 0 V |
| Support for the substrate: | grounded |

The ITO layer, the yttrium oxide ($Y_2O_3$) layer and the Al layer were formed in the same manner as in Example 7, so that a SrS:Ce,Cl TFEL device having the same structure as illustrated in FIG. 9 was fabricated.

Figure 10:
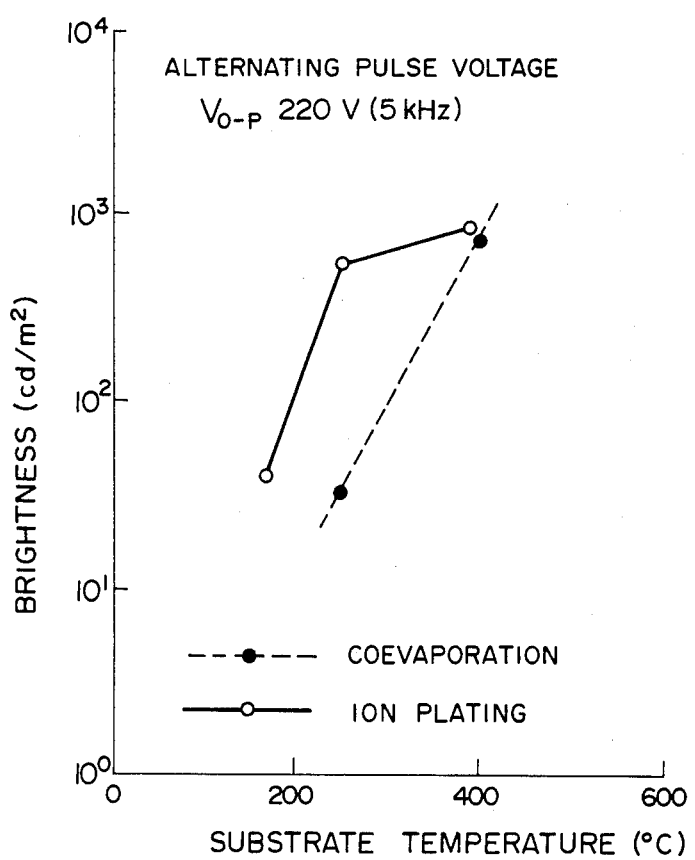
FIG. 10 is a graph showing the relationship between the temperature of a substrate at the formation of an EL emitting layer and the brightness of the electroluminescence of the EL emitting layer.

FIG. 10 shows the relationship between the substrate temperature at the formation of each EL layer and the brightness obtained with respect to the EL device fabricated by the coevaporation in Example 7 and the EL device fabricated by the ion plating method in Example 10.

The results shown in FIG. 10 indicate that the obtained brightness increased as the substrate temperature increased. However, in order to obtain an almost the same brightness, the substrate temperature of the EL device in Example 10 was lower by about 150° C. than that of the EL device fabricated in Example 7. Therefore, by the method employed in Example 10, the low temperature film formation effect can be attained.

EXAMPLE 11

Example 7 was repeated except that the reactive coevaporation apparatus as shown in FIG. 1 was employed instead of the apparatus shown in FIG. 7 and sulfur (S) was placed in the evapoaration cell 2, so that iononization coevaporation was performed, whereby a SrS:Ce,Cl TFEL device having the same structure as that of the EL device in Example 7 was fabricated.

In the above apparatus, the vaporized sulfur discharged from the evaporation cell 2, when passing between the two electrodes, is caused to collide with the thermions accelerated toward the ionization electrode 8, so that the vaporized sulfur is partly ionized. Electrons eliminated by the ionization are accelerated by the voltage $V_2$ applied between the two electrodes, and serve to ionize the vaporized sulfur in collaboration with the initially formed thermions.

The above process was repeated so that the ionization of the vaporized sulfur was accelerated. A plasma of sulfur was also observed around the sulfur evaporation cell 2.

The electric current $A_2$ flowing between the two electrodes was almost negligible under a low back pressure (about $10^{-6}$ Torr) at the time the sulfur evaporation cell 2 was not heated. However, when the vapor pressure of sulfur increased to the extent that the above-mentioned plasma was generated, the electric current $A_2$ abruptly increased. It is considered that this indicates that the electric current $A_2$ represents the degree of the ionization of sulfur. A product of the voltage $V_2$ and the electric current $A_2$, that is, $V_2A_2$, is defined as "ionization power".

The EL characteristics of the above fabricated SrS:Ce,Cl TFEL device were evaluated.

In terms of the relationship between the substrate temperature at the fabrication of the SrS:Ce,Cl layer and the brightness obtained, when the ionization power was 40 W or more, almost the same relationship as in the case of the ion plating in Example 10 was obtained. Therefore, it was found that the method employed in this example also has the low temperature film formation effect.

Furthermore, it was found that the EL emission color changes as the ionization power was increased. More specifically, in the case of Example 10 in which no ionization process was employed, the obtained EL emission color was classified as "bluish green" in the chromaticity coordinates although it may be generally called blue. In contrast to this, in the case of this example in which the additional ionization process was employed, it was confirmed that the EL emission color changed toward pure blue as the ionization power was increased. For example, "Greenish Blue" emission was obtained by an EL device fabricated at an ionization power of 180 W emitted.

From the results of Examples 7 to 9, it was found that the SrS EL layer and the CaS EL layer, respectively, fabricated by the coevaporation of strontium iodide and sulfur and by the coevaporation of calcium iodide and sulfur exhibit better emission characteristics than the EL devices fabricated by the electron beam evaporation of SrS or CaS.

This is considered to be because the crystallinity of the SrS and CaS layers is more suitable for the EL host material in the former EL layers. As the alkaline earth elements, Mg and Ba have substantially the same effect as Sr and Ca.

In the case of activators, Eu and Ce, the EL emission is mainly caused by the transition in the f electron orbit—the d electron orbit within $Eu^{2+}$ and $Ce^{3+}$. Although the EL emission color is more or less affected by the crystalline field thereof. However, in the case of lanthanoid rare-earth elements, such as Tb and Sm, the EL emission is mainly caused by the transition in the f electron orbit, and the EL emission color is rarely affected by the crystalline field thereof.

Therefore, when lanthanoid rare-earth elements other than Eu and Ce are employed in the above-mentioned examples, the higher brightness in the EL emission can be attained while the conventionally obtained EL emission colors are likewise obtained.

Further, in the above Examples, the alkaline earth iodides are employed as one component for the coevaporation. Instead of such alkaline iodides, alkaline earth chlorides can also be employed. However, alkaline earth fluorides are not suitable since the fluorides themselves are stable and a large amount of fluorine is mixed in the thin film, so that an evaporation source using a heating resistor cannot be employed.

From the results obtained in Examples 10 and 11, it was confirmed that the low temperature film formation effect is available with respect to the high melting compound SrS. In Examples 10 and 11, different ionization processes were employed, that is, oscillating electric field in Example 10 and thermion collision in Example 11. In the present invention, other ionization or plasma-conversion processes, such as the multi-cathode method, the DC method, the cluster-ion-beam method, can also be employed.

It is considered that the changes in the EL emission color in Example 11 are caused for the following reasons: The crystalline field of the host material SrS is changed by the ionization power at the time of fabrication of the EL layer, and the 5d level, which is the excitation level of the activator Ce, is affected by the change of the crystalline field of SrS. Therefore, the similar EL emission color change can also be caused to take place likewise when CaS is employed as the host material.

In the above-mentioned method, all the evaporation sources or cells can be heated by a heating resistor. Therefore, unlike the electron beam evaporation method, the evaporation area can be changed as desired and a large evaporation area is obtained without difficulty.

According to the present invention, electroluminescent thin film devices including an EL emitting layer comprising an alkaline-earth selenide or an alkaline-earth sulfide as the luminescent host material, and a lanthanoid rare-earth element as an activator, can be fabricated with the improvement of the brightness of the EL emission, the enlargement of the EL layer and the low temperature EL layer formation. In particular, the TFEL device in which the alkaline-earth selenide is employed as the luminescent host material can attain multi-color EL emission and the SrS:Ce TFEL device can attain excellent blue EL emission with high color purity.

What is claimed is:

1. A thin film electroluminescent device including an electroluminescent emitting layer which comprises a luminescent host material consisting of SrSe or CaSe, and a lanthanoid rare-earth element as activator.

2. The thin film electroluminescent device as claimed in claim 1, wherein said lanthanoid rare-earth element is selected from the group consisting of Ce, Eu and Tb.

3. A thin film electroluminescent device comprising:
   a substrate,
   a transparent electrode layer formed on said substrate,
   an electroluminescent emitting layer comprising a luminescent host material consisting of SrSe or CaSe, and a lanthanoid rare-earth element as activator, formed on said transparent electrode layer,
   an insulating layer formed on said electroluminescent emitting layer, and
   an electrode formed on said insulating layer.

4. The thin film electroluminescent device as claimed in claim 3, wherein another insulating layer which may be identical with or different from said insulating layer is interposed between said transparent electrode layer and said electroluminescent emitting layer.

* * * * *